(12) United States Patent
Tsurusaki et al.

(10) Patent No.: US 8,652,344 B2
(45) Date of Patent: Feb. 18, 2014

(54) LIQUID TREATMENT METHOD AND STORAGE SYSTEM

(75) Inventors: Kotaro Tsurusaki, Tosu (JP); Hiroshi Tanaka, Tosu (JP); Takayuki Toshima, Koshi (JP); Kazuyoshi Eshima, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 268 days.

(21) Appl. No.: 12/403,286

(22) Filed: Mar. 12, 2009

(65) Prior Publication Data

US 2009/0179007 A1    Jul. 16, 2009

Related U.S. Application Data

(62) Division of application No. 10/540,762, filed as application No. PCT/JP2005/006120 on Mar. 30, 2005, now abandoned.

(30) Foreign Application Priority Data

Apr. 15, 2004   (JP) .................... 2004-119810
Jul. 28, 2004   (JP) .................... 2004-219500

(51) Int. Cl.
   *B44C 1/22*   (2006.01)
(52) U.S. Cl.
   USPC ........................................ 216/83
(58) Field of Classification Search
   USPC ................... 134/902; 216/88, 83
   See application file for complete search history.

(56) References Cited

U.S. PATENT DOCUMENTS

| 4,985,111 A | * | 1/1991 | Ketelhohn .............. 216/92 |
| 5,625,433 A | * | 4/1997 | Inada et al. ............ 396/604 |
| 5,746,233 A | | 5/1998 | Kuroda et al. |
| 5,922,138 A | | 7/1999 | Shindo et al. |

(Continued)

FOREIGN PATENT DOCUMENTS

| JP | 06-204201 | 7/1994 |
| JP | 10-229065 | 8/1998 |
| JP | 10-335295 | 12/1998 |

OTHER PUBLICATIONS

Computer generated Machine Translation of JP 229065. Published Aug. 1998.y.*

(Continued)

*Primary Examiner* — Sylvia R MacArthur
(74) *Attorney, Agent, or Firm* — Morrison & Foerster LLP

(57) ABSTRACT

A plurality of process liquid supply nozzles 10 are arranged at different levels on right and left sides of a semiconductor wafer W in a process bath 1. A discharge port of each of the nozzles 10 is directed toward the semiconductor wafer W. In accordance with a predetermined procedure, a process liquid is discharged from one or more nozzles 10 selected from the plurality of nozzles 10. In order to perform a chemical liquid treatment, a chemical liquid is discharged from the lowermost nozzle 10, for example, and thereafter, the nozzles 10 on the upper levels sequentially discharge the chemical liquid. In order to perform a rinse liquid treatment by replacing the chemical liquid in the process bath 1 with a rinse liquid, the rinse liquid is discharged from the lowermost nozzle 10 at first, for example. Thereafter, the rinse liquid is discharged from all the nozzles 10. In this manner, efficiency and uniformity in the liquid treatment can be improved.

2 Claims, 11 Drawing Sheets

(56) References Cited

U.S. PATENT DOCUMENTS

| | | |
|---|---|---|
| 6,613,692 B1 | 9/2003 | Toshima et al. |
| 6,869,499 B2 | 3/2005 | Toshima et al. |
| 7,191,785 B2 | 3/2007 | Toshima et al. |
| 2002/0020714 A1 | 2/2002 | Pozniak et al. |
| 2002/0036006 A1 | 3/2002 | Ueda et al. |
| 2002/0045008 A1 | 4/2002 | Toshima et al. |
| 2002/0155709 A1 | 10/2002 | Toshima et al. |
| 2004/0063319 A1 | 4/2004 | Toshima et al. |
| 2005/0051246 A1 | 3/2005 | Toshima et al. |
| 2006/0060232 A1 | 3/2006 | Tsurusaki et al. |
| 2007/0204885 A1 | 9/2007 | Toshima et al. |

OTHER PUBLICATIONS

Computer generated English Translation of JP-10-335295 published Dec. 18, 1998.

Supplementary European Search Report mailed Dec. 14, 2010, for EP Application No. 05727891.3, three pages.

* cited by examiner

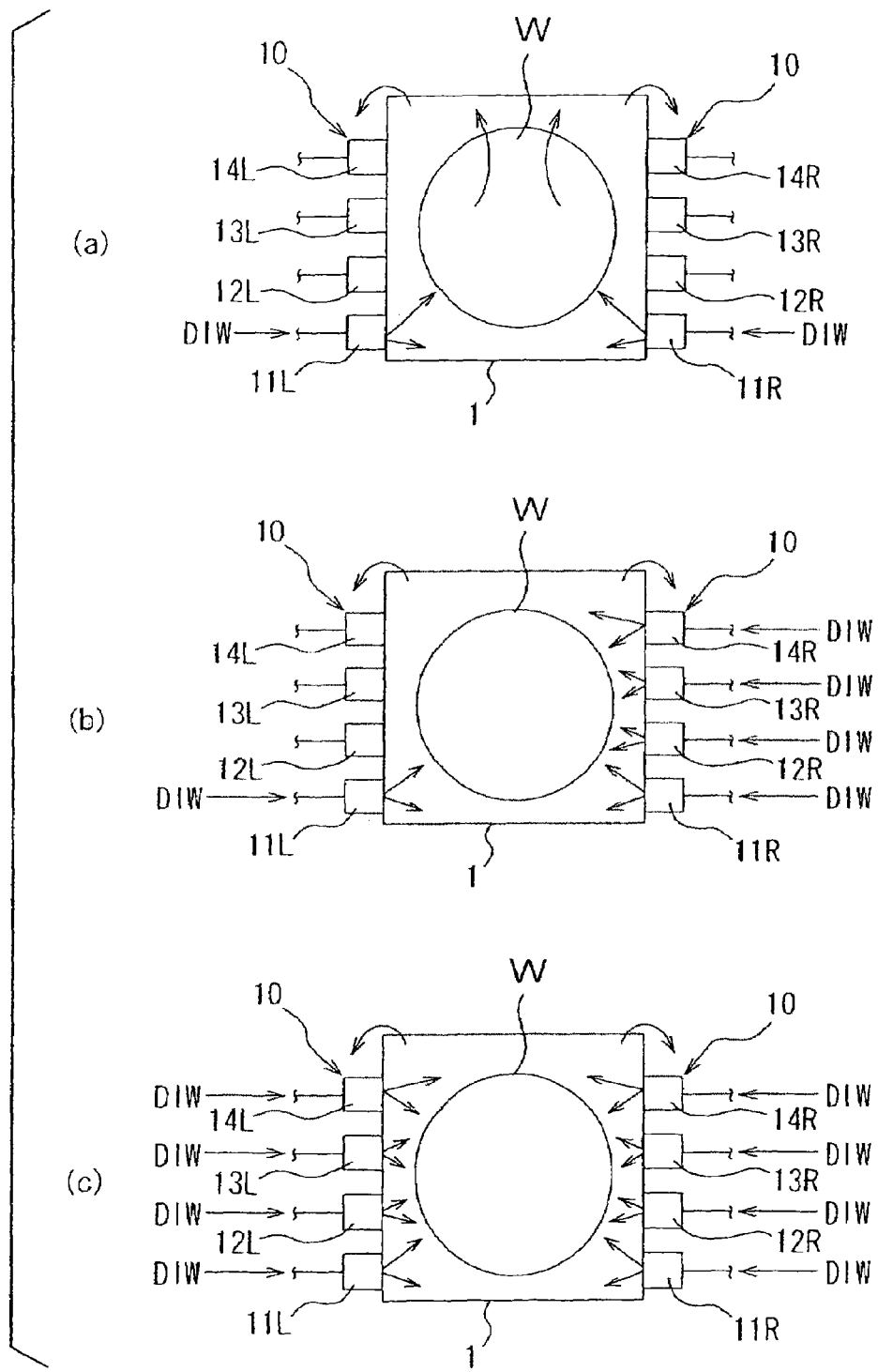
F I G. 10

LIQUID TREATMENT METHOD AND STORAGE SYSTEM

CROSS-REFERENCE TO RELATED APPLICATIONS

This is a division of U.S. Ser. No. 10/540,762, filed Oct. 27, 2005, which is a national stage under 35 USC §371 of International Application PCT/JP2005/006120, filed on Mar. 30, 2005, which claims priority benefit of Japanese Patent Application No. 2004-119810 filed Apr. 15, 2004 and Japanese Patent Application No. 2004-219500 filed Jul. 28, 2004. The entire contents of those applications are hereby incorporated by reference herein.

BACKGROUND OF THE INVENTION

1. Field of the Invention

The present invention relates to an apparatus and a method for performing a treatment by supplying a process liquid to process objects such as semiconductor wafers and LCD glass substrates.

2. Background Art

In manufacturing semiconductor devices, a liquid treatment such as an etching treatment or a cleaning treatment is performed to process objects such as semiconductor wafers or LCD glass substrates by supplying a process liquid such as a chemical liquid or a rinse liquid into a process bath holding the process liquid in which the process objects are immersed.

JP10-229065A discloses a liquid treatment apparatus including process liquid discharge ports, which are disposed on opposite corners of a process bath accommodating process objects therein, and which alternately discharge a process liquid. The process liquid discharge ports arranged at one of the corners firstly discharges the process liquid. Thus, a process liquid convection is generated in the process bath, so that particles flow together with the convection and are discharged from the process bath together with the process liquid overflowing from the process bath. At this time, a stagnation area, where the velocity of the process liquid flow is low and thus particles may stagnate, exists in the process bath. Thus, before the stagnation of the particles occurs, the discharge of the process liquid from the process liquid discharge ports at the one corner is stopped, and the discharge of the process liquid from the process liquid discharge ports on the other corner is started. The discharge of the process liquid from the discharge port at the other corner causes a new convection in the process bath, and the newly generated convention collides with the existing convection which has been generated by the discharge of the process liquid from the discharge ports at the one corner. Then, a disturbed flow of the process liquid caused by the collision of the convections moves the process liquid in the stagnated area. The process liquid thus moved flows with a new convection, and is discharged from the process bath together with the process liquid overflowing from the process bath. In this manner, the liquid treatment is performed while preventing re-adhesion of the particles to the process objects by periodically removing the stagnated area.

However, the stagnation occurs at the same location, and the process liquid does not flow through the location at a sufficiently high velocity. Further, the process liquid is not discharged directly toward the process objects. These may cause non-uniform treatment of the process objects. Such a problem is more serious when the liquid treatment is an etching treatment.

JP6-204201A discloses a liquid treatment apparatus that performs a chemical liquid treatment by supplying a chemical liquid to a process bath accommodating process objects, and thereafter performs a rinse treatment by supplying a rinse liquid to the process bath. Process liquids are supplied to the process bath from two supply nozzles arranged at bottom portions of the process bath. After the chemical liquid treatment, the rinse liquid is supplied from the supply nozzles so that the chemical liquid held in the process bath overflows therefrom, thereby the chemical liquid held in the process bath is replaced with the rinse.

In a preferred embodiment, the plurality of process liquid supply nozzles are divided into a first group and a second group, the process liquid supply nozzles belonging to the first group are arranged at different levels on one side of the process object, and the process liquid supply nozzles belonging to the second group are arranged at different levels on another side of the process object. In this embodiment, the plurality of process liquid supply nozzles are preferably arranged so that the first group includes process liquid supply nozzles each located at a level corresponding to that of each of the process liquid supply nozzles belonging to the second group. The liquid treatment may be a treatment that treats the process object with a chemical liquid as the process liquid. The controller may be configured to control the process liquid supply valves so that one of the process liquid supply nozzles of the first group and one of the process liquid supply nozzles of the second group, which are arranged at the same level, simultaneously discharge the process liquid at least in a part of the plurality of process liquid supply periods. Alternatively, the controller may be configured to control the process liquid supply valves so that the following conditions are alternately achieved repeatedly at least in a part of the plurality of process liquid supply periods: a condition in which one of the process liquid supply nozzles belonging to the first group discharges the chemical liquid while the process liquid supply nozzle belonging to the second group arranged at a level corresponding to that of the one of the process liquid supply nozzles belonging to the first group does not discharge the chemical liquid; and a condition in which one of the process liquid supply nozzles belonging to the second group discharges the chemical liquid while the process liquid supply nozzle belonging to the first group arranged at a level corresponding to that of the one of the process liquid supply nozzles belonging to the second group does not discharge the chemical liquid. The liquid treatment may also be a treatment that treats the process object with a rinse liquid as the process liquid. In this case, the controller may be configured to control the process liquid supply valves so that, at least in one of the plurality of process liquid supply periods, one of the process liquid supply nozzles belonging to the first group discharges the rinse liquid while the process liquid supply nozzle belonging to the second group arranged at a level corresponding to that of the one of the process liquid supply nozzles belonging to the first group does not discharge the rinse liquid.

SUMMARY OF THE INVENTION

An object of the present invention is to achieve a uniform liquid treatment of process objects.

A further object of the present invention is to achieve a uniform chemical liquid treatment of process objects.

A still further object of the present invention is to achieve prompt replacement of a chemical liquid in a process bath with a rinse liquid, after a chemical liquid treatment is performed.

In order to achieve the above objects, the present invention provides a liquid treatment apparatus for performing a liquid treatment to process objects, comprising: a process bath adapted to contain a process liquid and a process object therein; a plurality of process liquid supply nozzles arranged at different levels beside the process objects in the process bath, each of the nozzles having a discharge port directed toward the process object contained in the process bath; a plurality of process liquid supply valves adapted to control a supply of the process liquid from a process liquid supply source to the process liquid supply nozzles; and a sequence controller configured to control operations of the process liquid supply valves according to a predetermined sequence of operations, so that one or more process liquid supply nozzles selected from the plurality of process liquid supply nozzles discharge the process liquid in each of a plurality of process liquid supply periods, and that, a process liquid supply condition of at least one of the plurality of process liquid supply nozzles in each of the process liquid supply periods is different from that in an immediately preceding process liquid supply period.

In a preferred embodiment, the plurality of process liquid supply nozzles are divided into a first group and a second group, the process liquid supply nozzles belonging to the first group are arranged at different levels on one side of the process object, and the process liquid supply nozzles belonging to the second group are arranged at different levels on another side of the process object. In this embodiment, the plurality of process liquid supply nozzles are preferably arranged so that the first group includes process liquid supply nozzles each located at a level corresponding to that of each of the process liquid supply nozzles belonging to the second group. The liquid treatment may be a treatment that treats the process object with a chemical liquid as the process liquid. The controller may be configured to control the process liquid supply valves so that one of the process liquid supply nozzles of the first group and one of the process liquid supply nozzles of the second group, which are arranged at the same level, simultaneously discharge the process liquid at least in a part of the plurality of process liquid supply periods. Alternatively, the controller may be configured to control the process liquid supply valves so that the following conditions are alternately achieved repeatedly at least in a part of the plurality of process liquid supply periods: a condition in which one of the process liquid supply nozzles belonging to the first group discharges the chemical liquid while the process liquid supply nozzle belonging to the second group arranged at a level corresponding to that of the one of the process liquid supply nozzles belonging to the first group does not discharge the chemical liquid; and a condition in which one of the process liquid supply nozzles belonging to the second group discharges the chemical liquid while the process liquid supply nozzle belonging to the first group arranged at a level corresponding to that of the one of the process liquid supply nozzles belonging to the second group does not discharge the chemical liquid. The liquid treatment may also be a treatment that treats the process object with a rinse liquid as the process liquid. In this case, the controller may be configured to control the process liquid supply valves so that, at least in one of the plurality of process liquid supply periods, one of the process liquid supply nozzles belonging to the first group discharges the chemical liquid while the process liquid supply nozzle belonging to the second group arranged at a level corresponding to that of the one of the process liquid supply nozzles belonging to the first group does not discharge the chemical liquid.

In a further preferred embodiment, the liquid treatment is a treatment that treats the process object with a rinse liquid as the process liquid. In this embodiment, the controller may be configured to control the process liquid supply valves so that a lowermost one of the plurality of process liquid supply nozzles arranged at different levels discharges the rinse liquid, and thereafter the lowermost process liquid supply nozzle and at least one of process liquid supply nozzles selected from the process liquid supply nozzles other than the lowermost process liquid supply nozzle discharge the rinse liquid. In this case, the controller is preferably configured to control the process liquid supply valves so that the lowermost process liquid supply nozzle discharges the rinse liquid, and thereafter all the process liquid supply nozzles discharge the rinse liquid.

In a still further preferred embodiment, the liquid treatment is a treatment that treats the process object with a chemical liquid diluted with a rinse liquid, as the process liquid. In this embodiment, the process liquid supply source preferably includes a chemical liquid supply source and a rinse liquid supply source; a chemical liquid supply line connected to the chemical liquid supply source merges into a process liquid supply line, which connects the rinse liquid supply source to the process liquid supply nozzles; the chemical liquid supply line is provided with a flow control device adapted to control a flow rate of the chemical liquid flowing from the chemical liquid supply line into the process liquid supply line; and the controller is preferably configured to control the flow control device depending on a flow rate of the process liquid being supplied to the process liquid supply nozzles through the process liquid supply line so that a concentration of a chemical component in the process liquid is maintained substantially constant. More preferably, the controller is configured to control the process liquid supply valves so that the number of the process liquid supply nozzles discharging the process liquid in one of the process liquid supply periods is different from that of the process liquid supply nozzles discharging the process liquid in another process liquid supply period following the one of the process liquid supply periods; and the controller is also configured to control the flow control device depending on the number of the process liquid supply nozzles discharging the process liquid, so that the concentration of the chemical component in the process liquid flowing through the process liquid supply line in the one of the process liquid supply periods is identical to that in the another process liquid supply period. The flow control device may be adapted to shut off a flow of the chemical liquid from the chemical liquid supply line into the process liquid supply line, thereby allowing the apparatus to selectively perform the liquid treatment using the chemical liquid diluted with the rinse liquid, or a liquid treatment using only the rinse liquid.

The present invention provides a liquid treatment method comprising the steps of: discharging a process liquid from one or more process liquid supply nozzles selected from a plurality of process liquid supply nozzles arranged in a process bath, each of the nozzles having a discharge port directed toward a process object contained in the process bath; and thereafter changing a process liquid discharge condition of at least one of the plurality of process liquid supply nozzles.

In a preferred embodiment, the process liquid supply nozzles arranged at different levels discharge the process liquid in different process liquid discharge periods.

In a further preferred embodiment, a process liquid supply nozzle arranged on one side of the process object discharges the process liquid, and thereafter a process liquid supply nozzle arranged another side of the process object discharges the process liquid.

The present invention provides a liquid treatment method comprising the steps of: performing a chemical liquid treatment by immersing a process object in a process bath containing a chemical liquid; and performing a rinse liquid treatment that rinses the process object and replaces the chemical liquid with the rinse liquid, wherein the rinse liquid treatment includes the steps of: discharging the rinse liquid from one or more process liquid supply nozzles selected from a plurality of process liquid supply nozzles arranged in a process bath, each of the nozzles having a discharge port directed toward the process object contained in the process bath; and thereafter changing a rinse-liquid discharge condition of at least one of the plurality of process liquid supply nozzles.

In a preferred embodiment, in a time period when the rinse liquid treatment is performed, both a process liquid supply nozzle arranged on one side of the process object and a process liquid supply nozzle arranged on another side of the process object discharge the rinse liquid.

In another preferred embodiment, in the rinse liquid treatment, the lowermost one of the plurality of process liquid supply nozzles discharges the rinse liquid, and thereafter all of the plurality of process liquid supply nozzles discharge the rinse liquid.

In another preferred embodiment, in the rinse liquid treatment, all of the plurality of process liquid supply nozzles discharge the rinse liquid, thereafter the lowermost one of the plurality of process liquid supply nozzles discharges the rinse liquid, and thereafter all of the plurality of process liquid supply nozzles discharge the rinse liquid.

The present invention provides a storage medium storing a software executable by a control computer of a liquid treatment apparatus, wherein the control computer controls the liquid treatment apparatus to perform a liquid treatment method according to the present invention upon execution of the software.

BRIEF DESCRIPTION OF THE DRAWINGS

FIG. 10 is a schematic sectional view showing a rinse liquid supply condition in still another rinse liquid treatment step of the liquid treatment method according to the present invention.

DETAILED DESCRIPTION OF THE PREFERRED EMBODIMENTS

Best embodiments of the present invention will be described in detail below, with reference to the accompanying drawings. Herein, a liquid treatment apparatus according to the present invention is applied to a cleaning apparatus for semiconductor wafers.

First Embodiment

The first embodiment is described with reference to FIGS. 1-3 and 8-10.

Figure 1:
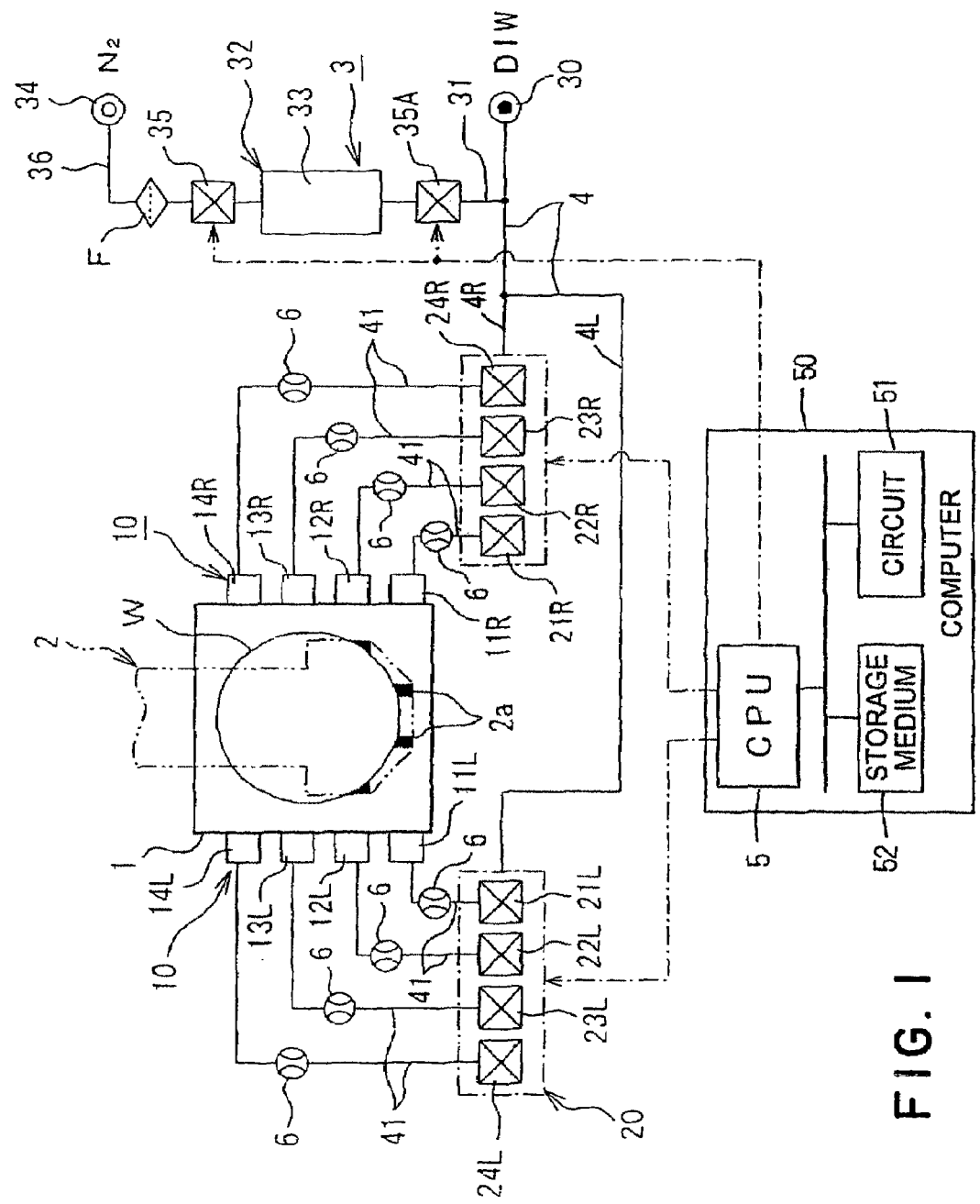
FIG. 1 is a piping diagram showing a piping system of a liquid treatment apparatus in a first embodiment of the present invention, with a schematic sectional view of a process bath.
Figure 2:
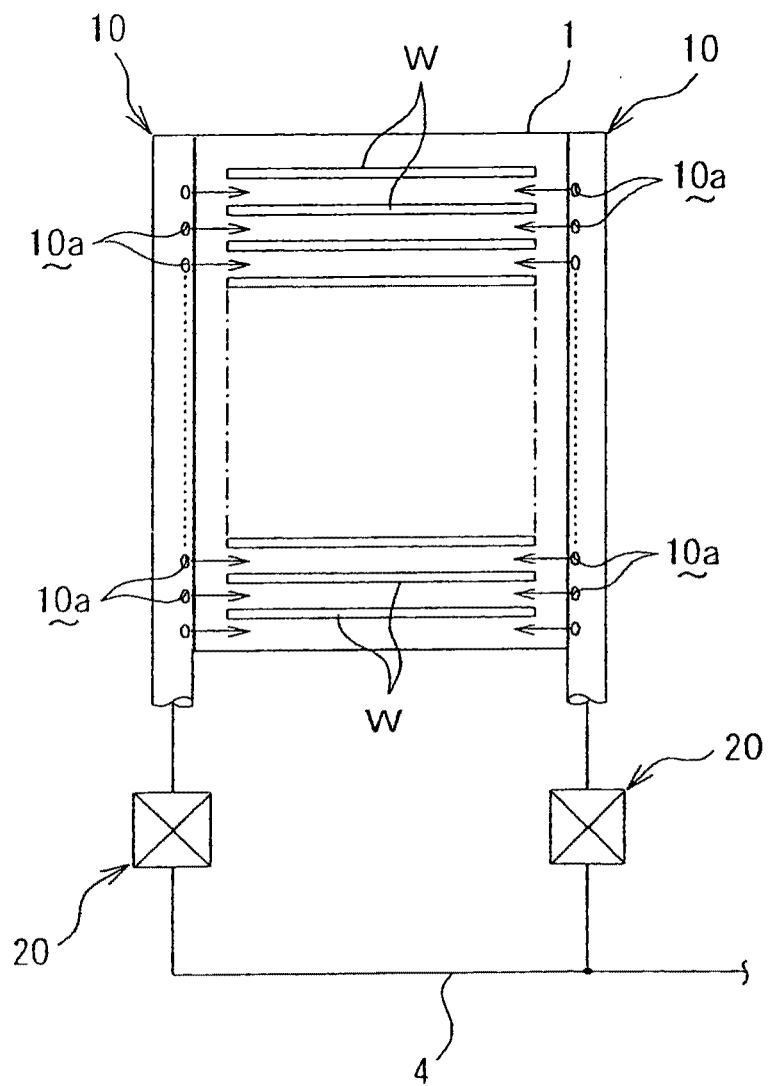
FIG. 2 is a schematic plan view of the process bath shown in FIG. 1.

In FIGS. 1 and 2 showing a constitution of a liquid treatment apparatus according to the present invention, the liquid treatment apparatus includes a process bath 1 for containing semiconductor wafers W (referred to as "wafer W" below), namely process objects. A plurality of pairs of process liquid supply nozzles 11R, 12R, 13R, 14R, 11L, 12L, 13L, and 14L are disposed in the process bath 1 on both sides of the wafers W. The respective nozzles can supply a process liquid toward the wafers W. In this embodiment, a chemical liquid or a rinse liquid is selectively supplied as a process liquid. In particular, the chemical liquid is diluted with the rinse liquid, and is supplied to the wafer W. In this embodiment, the chemical liquid is hydrofluoric acid (HF), while the rinse liquid is deionized water (DIW). The hydrofluoric acid is diluted with the deionized water to be supplied as diluted hydrofluoric acid (DHF). In the illustrated embodiment, the right-side nozzles (nozzles belonging to a first group) denoted with a subscript R, and the left-side nozzles (nozzles belonging to a second group) denoted with a subscript L are respectively disposed along opposite sidewalls of the process bath 1. The nozzles 11R, 12R, 13R, and 14R are vertically spaced apart from each other, and are disposed in this order from the bottom on the sidewall on the right side of the wafer W. The nozzles 11L, 12L, 13L, and 14L are vertically spaced apart from each other, and are disposed in this order from the bottom on the sidewall on the left side of the wafer W. The nozzles indicated by the same number are arranged at the same level. However, the right-side nozzles and the left-side nozzles may vertically be staggered. When these nozzles 11R, 12R, 13R, 14R, 11L, 12L, 13L, and 14L do not need to be independently identified, the nozzles are also referred to as "nozzle(s) 10". The liquid treatment apparatus further includes process liquid supply valves 21R, 22R, 23R, 24R, 21L, 22L, 23L, and 24L, each for controlling a supply of a process liquid to the respective nozzles 11R, 12R, 13R, 14R, 11L, 12L, 13L, and 14L. When these valves 21R, 22R, 23R, 24R, 21L, 22L, 23L, and 24L do not need to be independently identified, the valves are referred to as "valve(s) 20". Each of the valves 20 can be opened and closed, and the opening thereof can be adjusted. The liquid treatment apparatus further includes open-close valves 35 and 35A. The open-close valves 35 and 35A serve as switching means for switching the supply of the DHF to the supply of the DIW and vice versa to the nozzles 10. The liquid treatment apparatus further includes a control computer 50 incorporating a central processing unit 5 (hereinafter referred to as "CPU 5") as a controller for controlling the open-close valves 35 and 35A.

A wafer boat 2 capable of vertical movement is disposed above the process bath 1. The wafer boat 2 is provided with holding bars 2a for holding a plurality of, e.g., 50 wafers W while they are aligned in a horizontal direction in vertical postures. The plurality of wafers W held by the wafer boat 2 are loaded in the process bath 1, by lowering the wafer boat 2.

Figure 3:
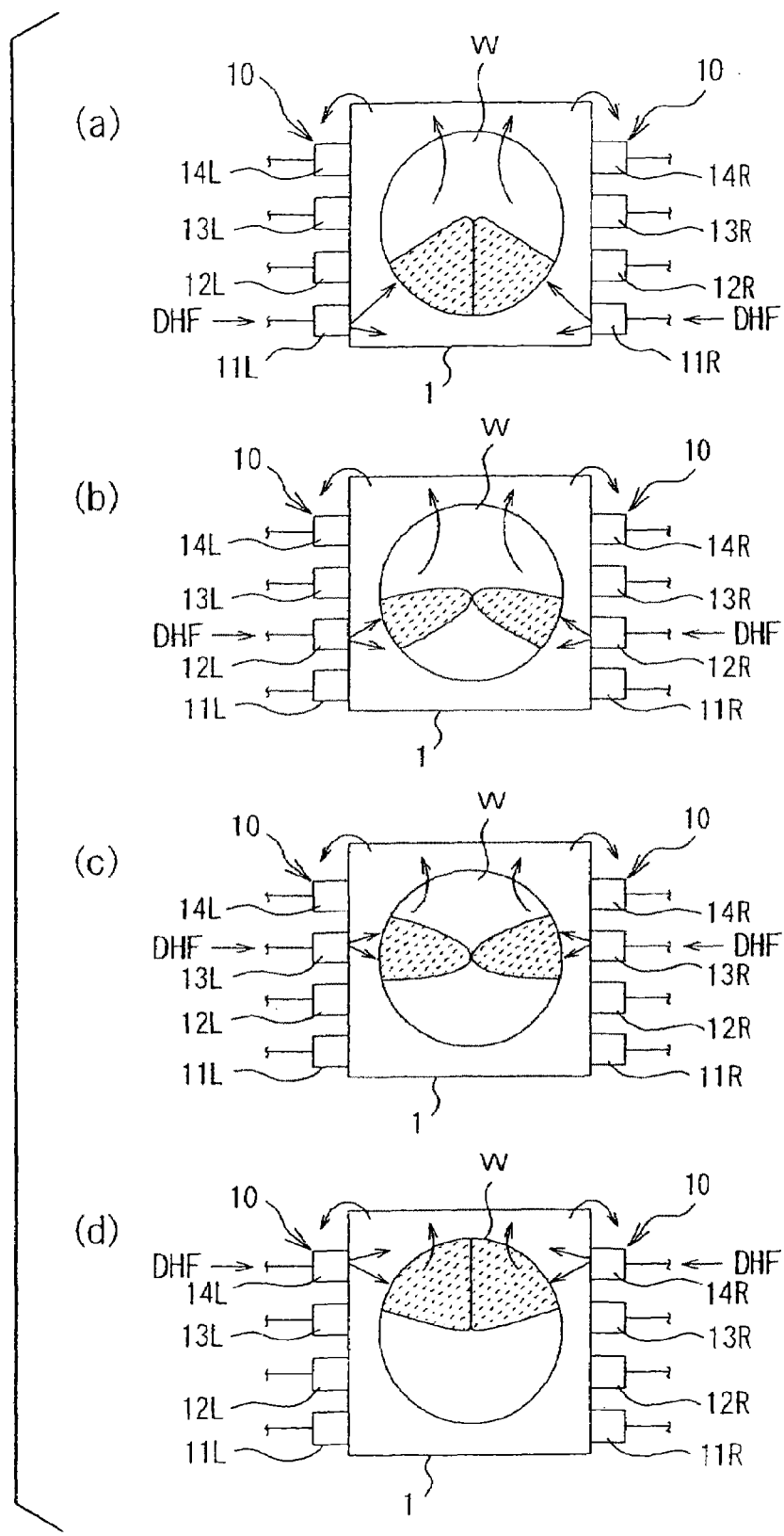
FIG. 3 is schematic sectional view showing a chemical liquid supply condition in a chemical liquid treatment step of a liquid treatment method according to the present invention.

As best shown in FIG. 2, each of the process liquid supply nozzles 10 is in a form of a pipe horizontally extending along the sidewall of the process bath 1. A plurality of nozzle holes 10a are formed in each of the nozzles 10. Pitches of the nozzle holes 10a are the same as those of the wafers W held by the wafer boat 2. Each of the nozzle holes 10a is located at a position corresponding to a space between adjacent wafers W. Each two of the plurality of nozzle holes 10a are formed at the same position with respect to the longitudinal direction of the nozzle 10. The two nozzle holes 10a are arranged such that one jets the process liquid upward while the other jets the process liquid downward. In FIG. 3, as is apparent from the arrows indicating jetting directions of the process liquid, an axis of at least one of the two nozzle holes 10a is directed toward a space between the adjacent wafers W. In other words, as viewed from a direction perpendicular to the surfaces of the wafers W (see FIG. 3), an extension of the axis of at least one of the two nozzle holes 10a crosses the wafers W. Thus, the process liquid is jetted from at least one of each two nozzle holes 10a toward a space between adjacent wafers W.

Referring again to FIG. 1, the liquid treatment apparatus includes a process liquid supply source 3 having a deionized water (rinse liquid) supply source 30 and a chemical liquid supply source 32. A process liquid supply line 4 is connected to the deionized water supply source 30, for supplying the process liquid to the respective process liquid supply nozzles 10. A chemical liquid supply line 31 connected to the chemical liquid supply source 32 is connected to the process liquid supply line 4. The process liquid supply line 4 is divided into a line 4R for the right-side nozzles and a line 4L for the left-side nozzles. Each of the lines 4R and 4L is divided into a plurality of branch lines 41 which are respectively connected to the process liquid supply nozzles 10. Each of the branch lines 41 is provided with one of the process liquid supply valves 20 (also see FIG. 2) and a flowmeter 6 (not shown in FIG. 2). In accordance with a control signal sent from the control computer 50, each of the valves 20 is opened and closed, and the opening of each of the valves 20 is adjusted if required.

The chemical liquid supply source 32 includes: a chemical liquid reservoir tank 33; a supply source 34 of a pressure gas (nitrogen (N.sub.2) gas, in this embodiment) for compressing a concentrated chemical liquid (HF) stored in the chemical liquid reservoir tank 33 to feed the concentrated chemical liquid into the chemical liquid supply line 31; a gas supply line 36 connecting the chemical liquid reservoir tank 33 and the N.sub.2 gas supply source 34; the open-close valve 35 provided on the gas supply line 36 to adjust the delivery rate of the HF from the chemical liquid reservoir 33; and the open-close valve 35A provided on the chemical liquid supply line 31. A switching means of the process liquids is composed of the open-close valves 35 and 35A. The open-close valves 35 and 35A are opened and closed in accordance with control signal sent from the control computer 50. When the open-close valves 35 and 35A are opened, the HF flowing from the chemical liquid supply line 31 flows into the process liquid supply line 4 to merge into the DIW flowing through the process liquid supply line 4. Thus, the DHF is supplied to the nozzles 10 as the process liquid. When the open-close valves 35 and 35A are closed, only the DIW is supplied to the nozzles 10. A filter F is disposed on the gas supply line 36 at a position between the N.sub.2 gas supply source 34 and the open-close valve 35.

Sequence of the chemical liquid treatment and the rinse liquid treatment performed by the liquid treatment apparatus as constituted above is described, with reference to FIGS. 3 and 8-10.

The chemical liquid treatment process and the rinse liquid treatment process described below are automatically performed under the control of the control computer 50 including the CPU 5, i.e., a controller. All the functional elements, including the above-described process liquid supply valves 20 and the open-close valves 35 and 35A, of the liquid treatment apparatus are connected to the control computer 50 through signal lines, and thus are operated in accordance with commands given by the control computer 50. Herein, the functional elements mean all the elements which are operated to perform a predetermined liquid treatment process. That is, the functional elements include not only a control element such as a valve for controlling a supply of a process liquid, but also a driving mechanism for the wafer boat 2, a not-shown substrate conveyer, and so on. The control computer 50 is typically a general-purpose computer, which is capable of achieving given functions depending on a software to be executed.

In addition to the CPU 5, the control computer 50 includes a circuit 51 for supporting the CPU 5, and a storage medium 52 storing a control software. Upon execution of the control software, the control computer 50 controls the functional elements of the liquid treatment apparatus, in particular, the functional elements relating to the liquid supply operations, such as the process liquid supply valves 20 and the open-close valves 35 and 35A, so that respective steps of the below-described chemical liquid treatment process and the rinse liquid treatment process, which are defined by a predetermined process recipe (a process liquid supply sequence or a valve operation sequence, in this embodiment), are executed.

Figure 4:
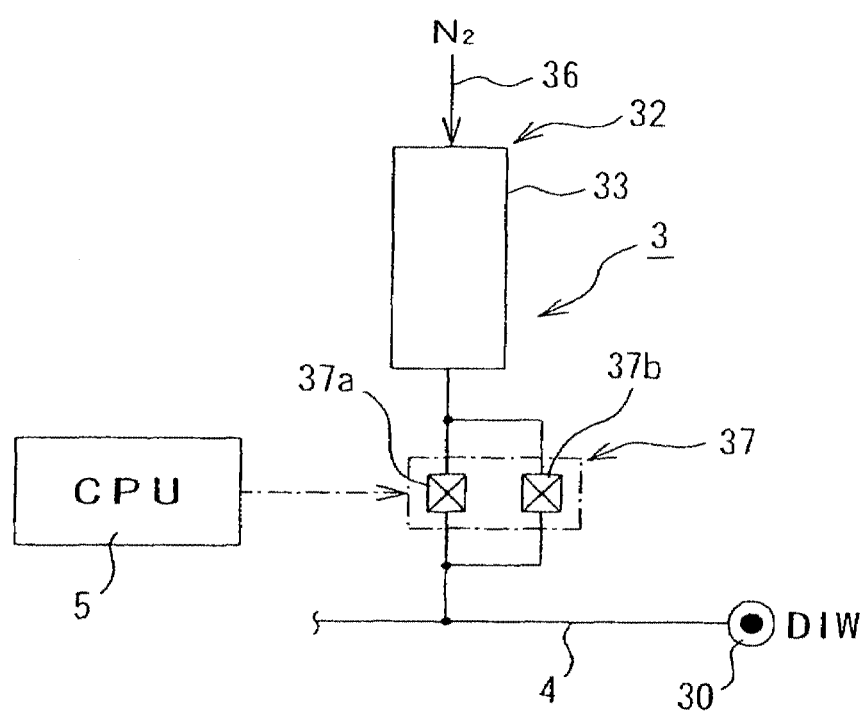
FIG. 4 is a piping diagram showing a different part of a liquid treatment apparatus in a second embodiment of the present invention from that of the first embodiment.
Figure 7:
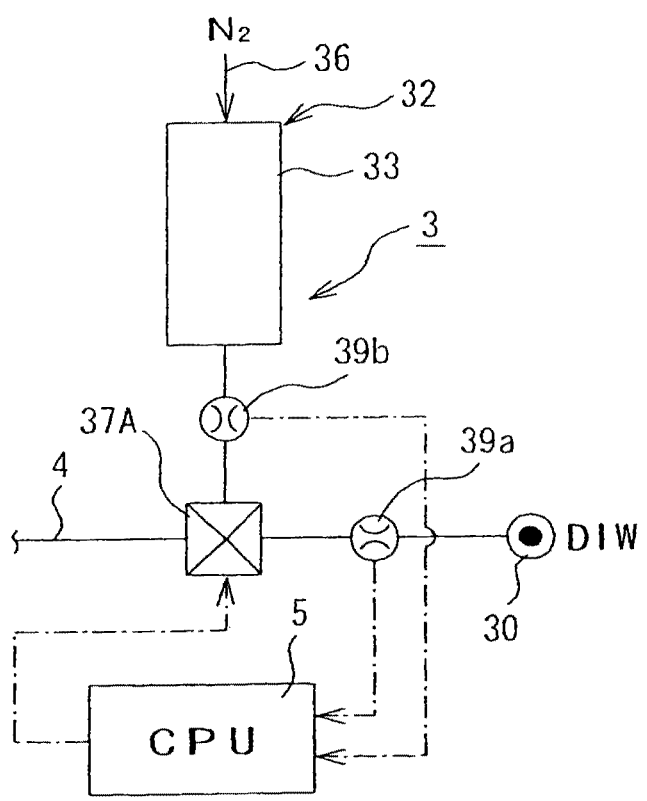
FIG. 7 is a piping diagram showing a different part of a liquid treatment apparatus in a third embodiment of the present invention from that of the first embodiment.

The storage medium 52 may be fixedly mounted to the control computer 50. Alternatively, the storage medium 52 may be such that it is removably loaded to a reader mounted to the control computer 50 and is readable by the reader. In the most typical embodiment, the storage medium 52 is a hard disk drive in which a control software is installed by service personnel of the manufacturing company of the liquid treatment apparatus. In another embodiment, the storage medium 52 may be a removable disk such as a CD-ROM or a DVD-ROM in which a control software is written. Such a removable disk is read by an optical reader mounted to the control computer 50. The storage medium 52 may either be a RAM (random access memory) type or a ROM (read only memory) type. Alternatively, the storage medium 52 may be a cassette type ROM or a memory card. In short, any medium known in the technical field of a computer can be employed as the storage medium 52. In a factory where a plurality of liquid treatment apparatuses are used, a management computer that performs overall control of the control computers 50 of each of the liquid treatment apparatuses may store a control software therein. In this case, the respective liquid treatment apparatuses are operated by the management computer via communication lines to perform predetermined liquid treatment processes. Meanwhile, although only the CPU 5 of the control computer (50) is illustrated in FIGS. 4 and 7 for simplification, the liquid treatment apparatus shown in these figures actually includes the control computer having the same constitution as that shown in FIG. 1.

At first, a plurality of, e.g., 50 wafers W held by not shown wafer transfer means are delivered to the wafer boat 2, and the wafer boat 2 is lowered to immerse the wafers W in the DHF previously stored in the process bath 1.

Then, the process liquid supply valves (hereinafter referred to simply as "valves" below) 20 are switched in a manner described below in accordance with a predetermined process liquid supply sequence, so as to perform a chemical liquid treatment process. At first, only the valves 21R and 21L are opened to discharge the DHF from the lowermost process liquid supply nozzles (hereinafter referred to simply as "nozzles" below) 11R and 11L, so that a first chemical liquid treatment step (first etching treatment step) is performed (see FIG. 3(a)). After the first etching treatment step is performed for a certain period of time, the valves 21R and 21L are closed, and only the valves 22R and 22L are opened to discharge the DHF from the nozzles 12R and 12L second from the bottom, so that a second chemical liquid treatment step (second etching treatment step) is performed (see FIG. 3(b)). After the second etching treatment step is performed for a certain period of time, the valves 22R and 22L are closed, and only the valve 23R and 23L are opened to discharge the DHF from the nozzles 13R and 13L third from the bottom, so that a third chemical liquid treatment step (third etching treatment step) is performed (see FIG. 3(c)). After the third etching treatment step is performed for a certain period of time, the valves 23R and 23L are closed, and only the valves 24R and 24L are opened to discharge the DHF from the uppermost nozzles 14R and 14L, so that a fourth chemical liquid treatment step (fourth etching treatment step) is performed for a certain period of time (see FIG. 3(d)). In this manner, the chemical liquid treatment process (etching treatment process) is completed.

In the above chemical liquid treatment process, the DHF (process liquid) is sequentially discharged from the plurality of nozzles which are vertically arranged in multistage and are configured to discharge the DHF toward the wafers W. Thus, in at least one step of the first to fourth chemical liquid treatment steps, each and every region of each of the wafers W is exposed to the DHF flow of a high flow velocity. Accordingly, in-plane etch uniformity of each of the wafers W is improved.

Furthermore, as viewed from a direction perpendicular to the wafer surfaces (see FIG. 3), a convection having its center located in the wafer surface (this means that a stagnation area exists in the wafer surface) does not substantially occur. Thus, re-adhesion of particles to the wafers W, which may occur in the stagnation area, can be prevented. That is, particles generated during the etching treatment process are expelled from the process bath 1 together with the liquid overflowing from the process bath 1.

Upon completion of the etching treatment process (chemical liquid treatment process), the open-close valve 35 is closed to stop the supply of the chemical liquid. Thereafter, the process liquid supply valves 20 are switched to perform a rinse liquid treatment process in such a manner that different supply conditions of the process liquid (DIW) are achieved in different periods of time.

As shown in FIG. 8(a), at first, the valves 21R and 21L are opened to discharge the DIW as a rinse liquid from the lowermost nozzles 11R and 11L, so that a first rinse liquid treatment step is performed for a certain period of time. Then, as shown in FIG. 8(b), the valves 22R, 23R, 24R, 22L, 23L, and 24L are opened, with the valves 21R and 21L being still opened, so as to discharge the DIW from all the nozzles 11R, 12R, 13R, 14R, 11L, 12L, 13L and 14L, so that a second rinse liquid treatment step is performed for a certain period of time. In this manner, the rinse liquid treatment process is performed by replacing the DHF in the process bath 1 with the DIW, with the DHF and the DIW overflowing from the process bath 1.

In the above rinse liquid treatment, the DIW is supplied from the lowermost nozzles 11R and 11L in the first rinse liquid treatment step. Thus, the DHF in the bottom part of the process bath 1, which otherwise is difficult to be replaced with the DIW, is caught in a flow of the DIW flowing in the bottom part of the process bath 1 at a high flow velocity and finally overflowing from the process bath 1, thereby the DHF in the bottom part of the process bath 1 is promptly replaced with the DIW. In addition, the DIW is discharged toward the wafers W from the nozzles 10 disposed beside the wafers W. Thus, even if the DIW is discharged from the nozzles 10 at a high flow rate, the wafers W are not likely to be lifted, as compared with the case where nozzles, which are disposed at the bottom of the process bath and supply the rinse liquid upward, are used. Thus, in the second rinse liquid treatment step, it is possible to discharge the DIW at a high flow rate from the nozzle 10, and therefore the DHF can be promptly and effectively replaced with the DIW, which results in improvement in the throughput of the liquid treatment process. A rapid replacement of the process liquids can minimize the effects of the HF component remaining in the process bath 1 during the rinse liquid treatment, which results in improvement in the uniformity of the etching treatment process. In the second rinse liquid treatment step, the opening of each of the process liquid supply valves 20 is preferably increased.

The above-described rinse liquid treatment process may be modified as follows.

In a first modification, as shown in FIG. 9(a), in a first rinse liquid treatment step, the valves 21R and 21L are opened to discharge the DIW from only the lowermost nozzles 11R and 11L, whose operation is the same as that shown in FIG. 8(a); and thereafter, as shown in FIG. 9(b), in a second rinse liquid treatment step, the valves 22R, 23R, and 24R are opened while the valves 21R and 21L are kept opened to discharge the DIW from the lowermost left-side nozzle 11L and all the right-side nozzles 11R, 12R, 13R, and 14R, thereby the rinse liquid treatment process in the first modification is performed while the liquid in the process bath 1 overflows therefrom. Alternatively, in the second rinse liquid treatment step, the DIW may be discharged from the lowermost, right-side nozzle 11R and all the left-side nozzles 11L, 12L, 13L and 14L. With the above operations, since there occurs no collision of the flows of the DIW in spaces between any two adjacent wafers W, the DIW flow can smoothly pass through the spaces between any two adjacent wafers W. Thus, the rinse liquid treatment can be efficiently performed. Also in this case, even if the DIW is discharged at a high flow rate in the second rinse liquid treatment step, the wafers W are not likely to be lifted up.

In a second modification, as shown in FIG. 10(a) and FIG. 10(b), first and second rinse liquid treatment steps, which are the same as the first and second rinse liquid treatment steps described with reference to FIGS. 9(a) and 9(b), are sequentially performed. Thereafter, as shown in FIG. 10(c), a third rinse liquid treatment step, which is the same as the second rinse liquid treatment step described with reference to FIG. 8(b).

Figure 8:
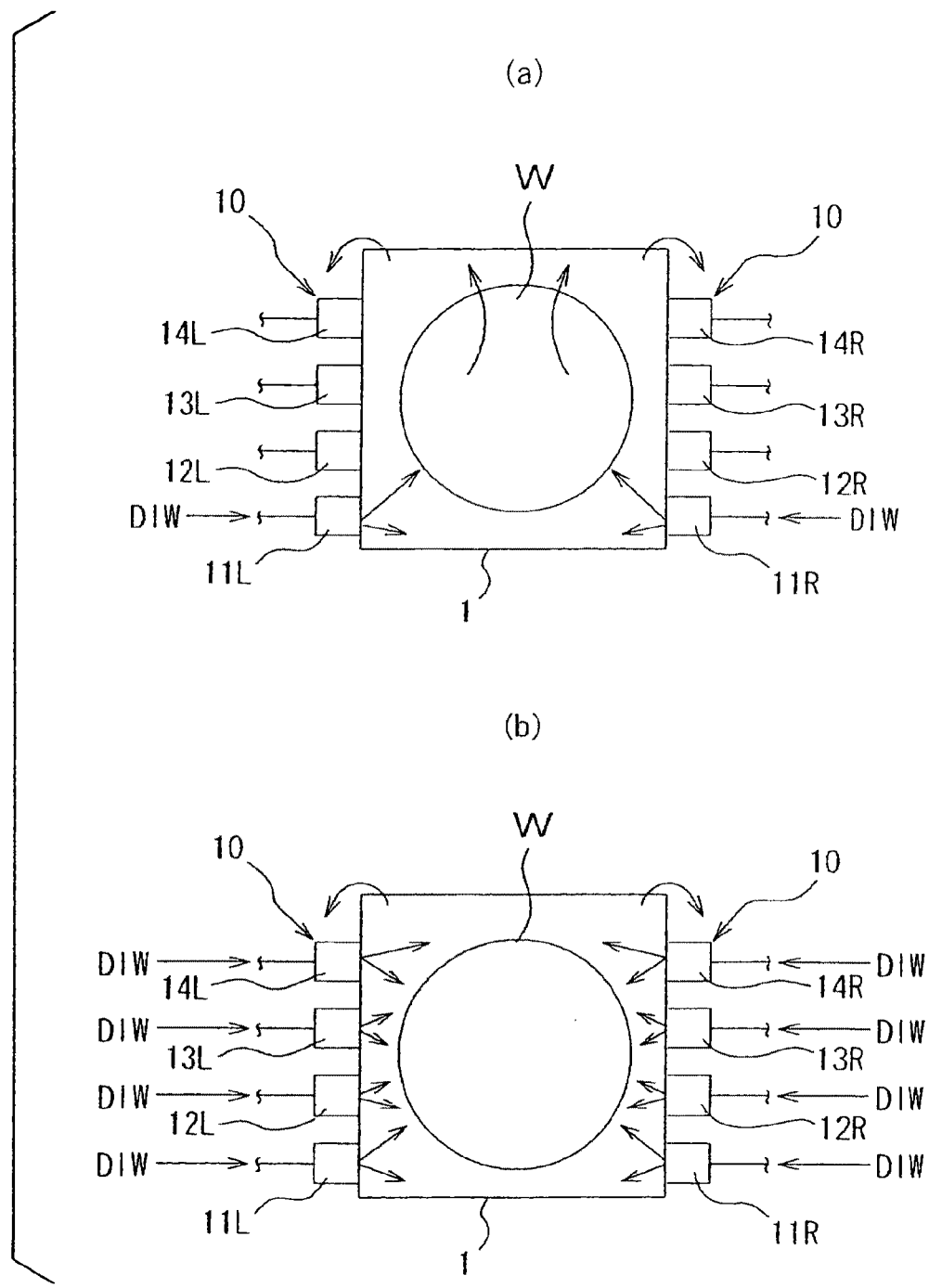
FIG. 8 is a schematic sectional view showing a rinse liquid supply condition in a rinse treatment step of the liquid treatment method according to the present invention.
Figure 9:
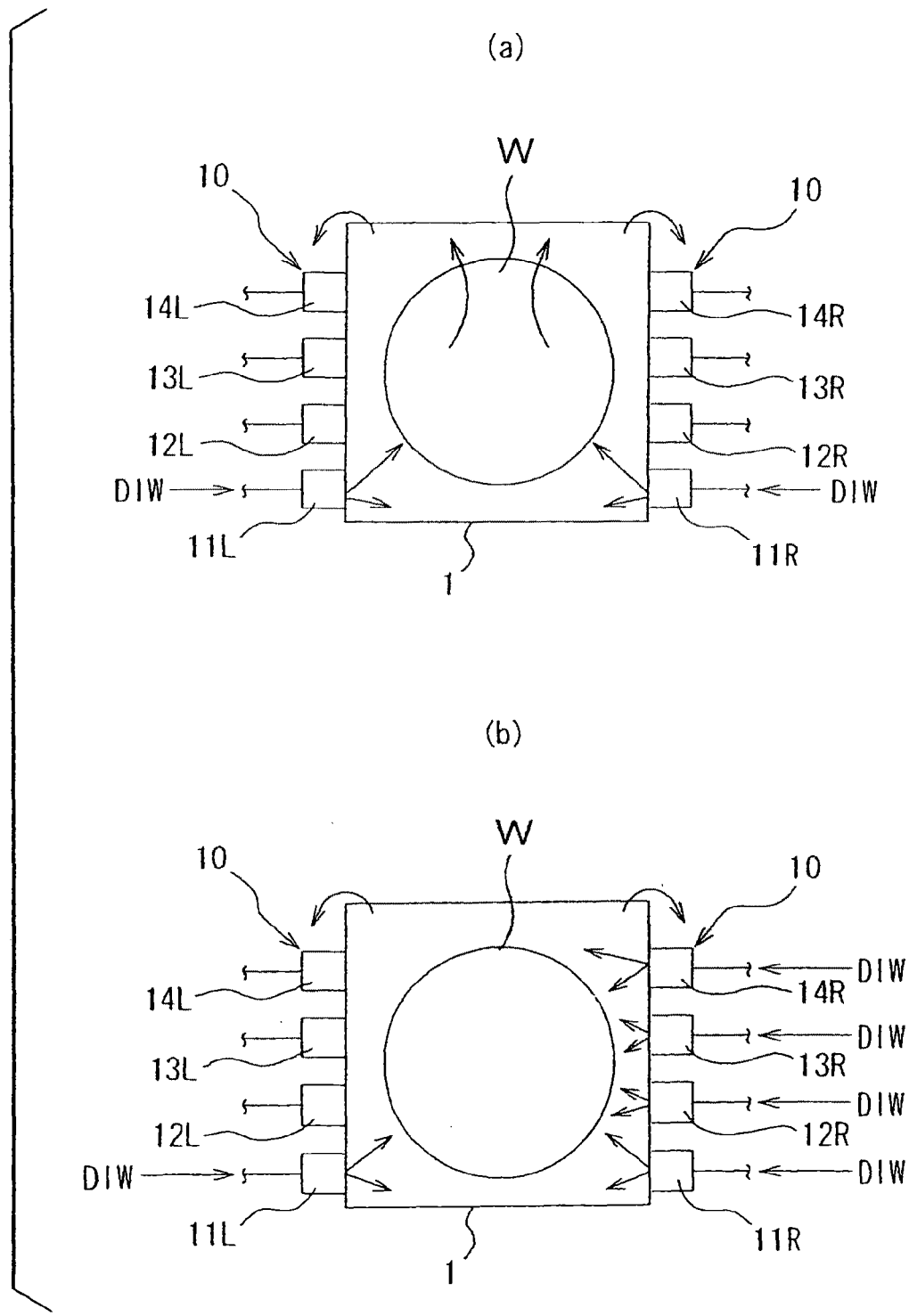
FIG. 9 is a schematic sectional view showing a rinse liquid supply condition in another rinse liquid treatment step of the liquid treatment method according to the present invention.

In the rinse liquid treatment shown in FIGS. 8 to 10, before the first rinse liquid treatment step is performed, in other words, before the DIW is discharged from the lowermost nozzles 11R and 11L, the DIW may be discharged from all the nozzles 11R, 12R, 13R, 14R, 11L, 12L, 13L and 14L. In this case, the period of time during which the DIW is discharged may be determined so that it ensures that the DHF remaining in the respective process liquid supply nozzles 10 and the pipes upstream the same are removed therefrom. If the remaining DHF is purged beforehand in this way, the replacement of the DHF can be carried out effectively.

After the rinse liquid treatment process including the plurality of treatment steps has been completed, all the process liquid supply valves 20 are closed, and the wafers W are unloaded from the process bath 1 by raising the wafer boat 2 and are delivered to the not shown wafer transfer means. In this manner, a series of liquid treatment processes are completed.

The above-described rinse liquid treatment process may also be modified as follows. After the DIW is discharged from the lowermost supply nozzles 11R and 11L for a certain period of time, the DIW is discharged from one or more nozzles selected from the supply nozzles 12R, 13R, 14R, 12L, 13L and 14L, while continuing discharging the DIW from the supply nozzles 11R and 11L. In this case, the nozzle or the combination of the nozzles selected from the supply nozzles 12R, 13R, 14R, 12L, 13L and 14L is changed at every period of time.

In the respective chemical liquid treatment steps of the above-described chemical liquid treatment process, the DHF is simultaneously discharged from the right and left nozzles 10 arranged at the same level. However the operation is not limited thereto. The DHF may be simultaneously discharged from the right and left nozzles 10 arranged at different levels in a certain chemical liquid treatment step, or may be discharged simultaneously from one or more nozzles 10 only on the right side or only on the left side in a certain chemical liquid treatment step. The chemical liquid treatment process may be performed by using only the right-side supply nozzles 10 or only the left-side supply nozzles 10, while the nozzle(s) discharging the liquid are suitably switched.

As described above, according to the first embodiment, the plurality of process liquid supply nozzles 10 are utilized, and a process liquid supply condition of at least one nozzle 10 in each of the process liquid supply periods (the respective treatment steps) is different from that in an immediately preceding process liquid supply period (i.e., from the discharging state to the non-discharging state and vice versa, in this embodiment). Therefore, the condition of the process liquid flow is varied in each of the process liquid supply periods, so that a rapid liquid treatment with an enhanced uniformity can be achieved.

Second Embodiment

Figure 5:
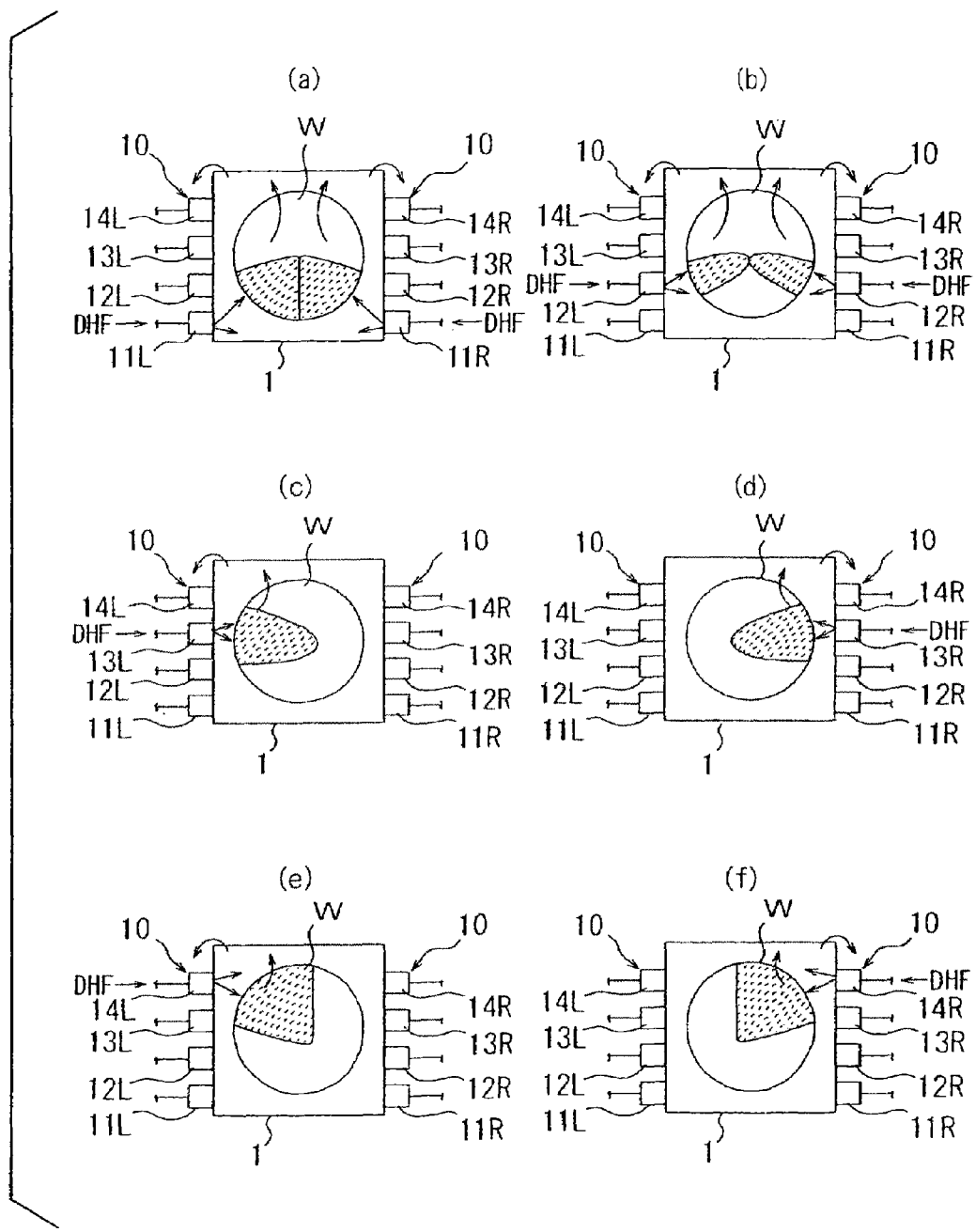
FIG. 5 is a schematic sectional view showing a chemical liquid supply condition in another chemical liquid treatment step of the liquid treatment method according to the present invention.

The second embodiment is described with reference to FIGS. 4 to 6. FIG. 4 is a piping diagram showing parts, of a liquid treatment apparatus in the second embodiment, which are different from those of the first embodiment. Parts, of the liquid treatment apparatus in the second embodiment, which are not shown in FIG. 4 are the same as those of the liquid treatment apparatus in the first embodiment, and thus the detailed description thereof are omitted.

In the second embodiment, a selector valve device 37 formed of open-close valves 37a and 37b is disposed on a chemical liquid supply line 31. The selector valve device 37 is controlled in accordance with a signal sent from a CPU 5 (control computer), such that, when the total flow rate of DHF supplied from process liquid supply nozzles 10 is changed, the HF concentration in the DHF being supplied is not varied.

The selector valve device 37 includes two open-close valves arranged in parallel, one being a first open-close valve 37a for a high flow rate disposed on the chemical liquid supply line 31, and the other being a second open-close valve 37b for low flow rate disposed on a bypass line 38 branched from the chemical liquid supply line 31. In this embodiment, the first open-close valve 37a when being opened allows the HF to pass therethrough at 2 L/min, while the second open-close valve 37b when being opened allows the HF to pass therethrough at 1 L/min.

In order to maintain the HF concentration in the DHF constant, the first and second open-close valves 37a and 37b are selectively opened in accordance with a control signal from the CPU 5 (control computer). In this embodiment, when two process liquid supply valves (for example, valves 21R and 21L) are opened to supply the DHF only from two process liquid supply nozzles (for example, nozzles 11R and 11L), a total flow rate of the DHF supplied to a process bath 1 is 20 L/min. When one of the supply valves 21R to 24R and 21L to 24L is opened to supply the DHF from only one of the supply nozzles 11R to 14R and 11L to 14L, a total flow rate of the DHF supplied to the process bath 1 is 10 L/min. The first and second open-close valves 37a and 37b are switched so that the HF concentration in the DHF being supplied to the process bath 1 in both cases is the same. That is, when the DHF is supplied from the two nozzles 11R and 11L, the first open-close valve 37a for a high flow rate is opened to allow the HF to flow at 2 L/min into the process liquid supply line 4. When the DHF is supplied from only one nozzle 10 for example, the supply nozzle 11R), the second open-close valve 37b for a low flow rate is opened to allow the HF to flow at 1 L/min into the process liquid supply line. Thus, the HF concentrations in the DHF in both the former and latter cases can be the same.

A series of liquid treatment processes carried out by the liquid treatment apparatus in the second embodiment will be described with reference to FIG. 5.

First of all, a plurality of, e.g., 50 wafers W held by a not shown wafer transfer means are delivered to a wafer boat 2, and the wafers W are then immersed in the DHF previously stored in the process bath 1 by lowering the wafer boat 2. Thereafter, under the control of the control computer 50, the respective valves 20 are sequentially opened and closed to perform the treatments as described below.

At first, only the valves 21R and 21L are opened to discharge the DHF from the lowermost supply nozzles 11R and 11L, so that a first chemical liquid treatment step (first etching treatment step) is performed (see FIG. 5(a)). After the first etching treatment step is performed for a certain period of time, the valves 21R and 21L are closed, and only the valves 22R and 22L are opened to discharge the DHF from the nozzles 12R and 12L second from the bottom, so that a second chemical liquid treatment step (second etching treatment step) is performed (see FIG. 5(b)). After the second etching treatment step is performed for a certain period of time, the valves 22R and 22L are closed, and only the valve 23L is opened to discharge the DHF from the left-side nozzle 13L third from the bottom, so that a third chemical liquid treatment step (third etching treatment step) is performed (see FIG. 5(c)). After the third etching treatment step is performed for a certain period of time, the valve 23L is closed, and only the valve 23R is opened to discharge the DHF from the right-side nozzle 13R third from the bottom, so that a fourth chemical liquid treatment step (fourth etching treatment step) is performed (see FIG. 5(d)). After the fourth etching treatment step is performed for a certain period of time, the valve 23R is closed, and only the valve 24L is opened to discharge the DHF from the left-side uppermost nozzle 14L, so that a fifth chemical liquid treatment step (fifth etching treatment step) is performed (see FIG. 5(e)). After the fifth etching treatment step is performed for a certain period of time, the valve 24L is closed, and only the valve 24R is opened to discharge the DHF from the right-side uppermost supply nozzle 14R, so that a sixth chemical liquid treatment step (sixth etching treatment step) is performed for a certain period of time (see FIG. 5(f)). In this manner, a series of chemical liquid treatment steps (etching treatment steps) are completed.

Figure 6:
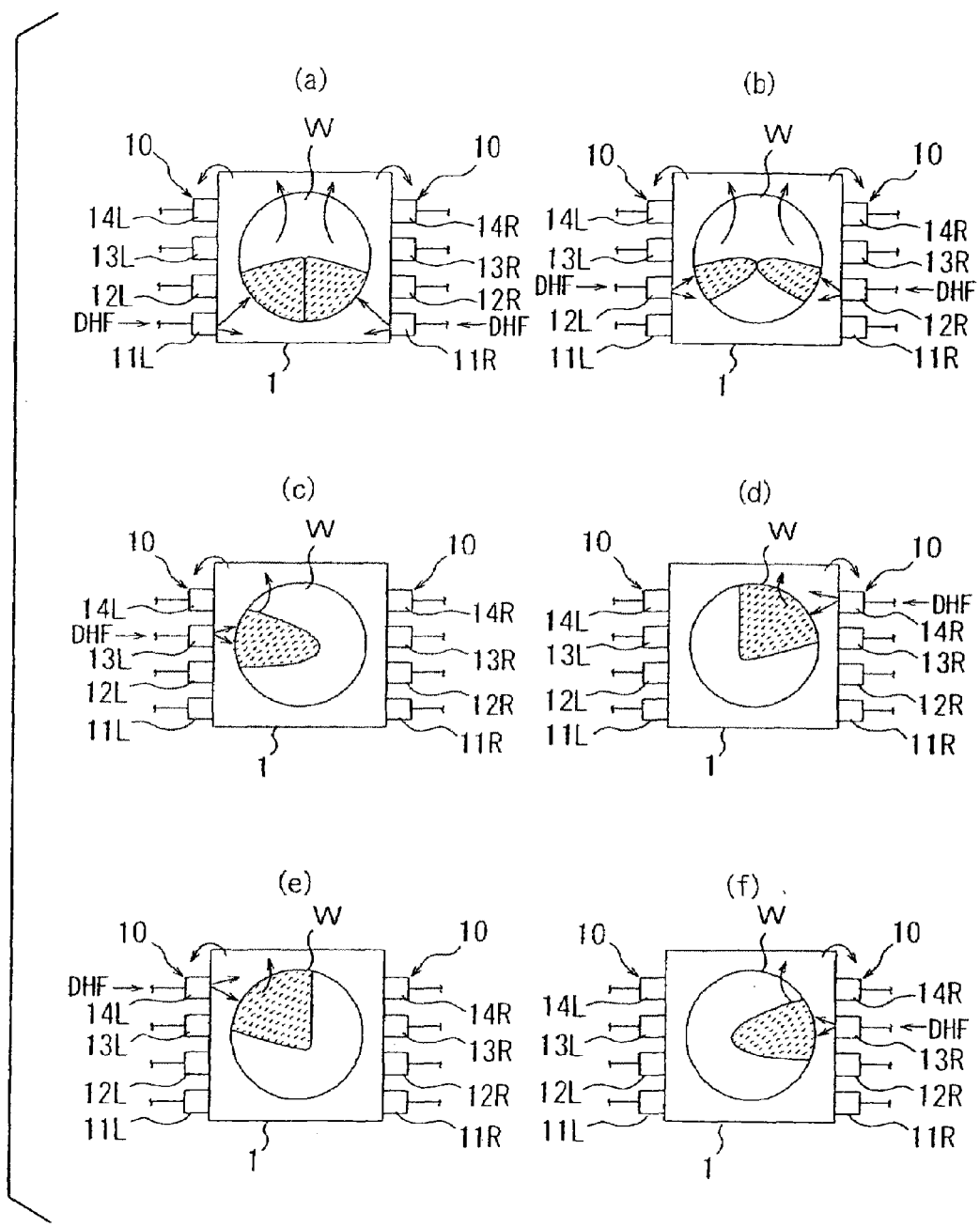
FIG. 6 is a schematic sectional view showing a chemical liquid supply condition in still another chemical liquid treatment step of the liquid treatment method according to the present invention.

In place of the aforementioned first to sixth treatment steps, as shown in FIG. 6, the etching treatment process may be carried out by sequentially performing the following: the discharge of the DHF from the supply nozzles 11R and 11L in the first etching treatment step (see FIG. 6(a)); the discharge of the DHF from the supply nozzles 12R and 12L in the second etching treatment step (see FIG. 6(b)); the discharge of the DHF from the supply nozzle 13L in the third etching treatment step of (see FIG. 6(c)); the discharge of the DHF from the supply nozzle 14R in the fourth etching treatment step (see FIG. 6(d)); the discharge of the DHF from the supply nozzle 14L in the fifth etching treatment step (see FIG. 6(e)); and the discharge of the DHF from the supply nozzle 13R in the sixth etching treatment step (see FIG. 6(f)).

If the DHF is discharged from the nozzle(s) 10 on only one side as shown in FIGS. 5(c) to 5(f) and FIGS. 6(c) to 6(f), there occurs no collision of the DHF flows near the central areas of the wafers W, which will occur when the DHF is simultaneously discharged from the supply nozzle(s) 10 on both right and left sides. Thus, the DHF smoothly flows at a high speed near the central areas of the wafers W, which ensures that the central areas of the wafers W are treated effectively. It is possible that the occurrence of irregular flows of the DHF due to the collision of the DHF flows impairs in-plane uniformity of the wafer treatment. However, such a problem will never occur if the DHF is supplied from the supply nozzle(s) 10 on only one side.

In FIG. 4, the selector valve device 37 includes the two open-close valves 37a and 37b to enable two-stage flow rate adjustment. However, the device 37 may be configured to allow three or more stage flow rate adjustment, by providing an additional bypass line(s) to the chemical liquid supply line, and providing three or more open-close valves to the selector valve device.

The liquid treatment apparatus in the second embodiment can perform a rinse liquid treatment process similar to that in the first embodiment, after completion of the etching treatment process.

Third Embodiment

The third embodiment is described with reference to FIG. 7. FIG. 7 is a piping diagram showing parts, of a liquid treatment apparatus in the second embodiment, which are different from those of the first embodiment. Parts, of the liquid treatment apparatus in the second embodiment, which are now shown in FIG. 7 are the same as those of the liquid treatment apparatus in the first embodiment, and thus the detailed description thereof are omitted.

In the third embodiment, a first flowmeter 39a and a second flowmeter 39b are respectively disposed on a process liquid supply line 4 and a chemical liquid supply line 31. A flow control valve 37A whose opening can be adjusted is disposed on a connection between the process liquid supply line 4 and the chemical liquid supply line 31, or a part of the chemical liquid supply line 31 near the connection.

The flow rate of the DIW flowing through the process liquid supply line 4 is measured by the first flowmeter 39a, and the measured flow rate is transmitted to a control computer (CPU 5). The flow rate of the HF flowing through the chemical liquid supply line 31 is measured by the second flowmeter 39b, and the measured flow rate is transmitted to the control computer. The control computer calculates the HF flow rate required to obtain a predetermined concentration of the DHF to be supplied to supply nozzles 10 based on the DIW flow rate detected by the first flowmeter 39a, by using data or a relational expression stored in the computer beforehand. The control computer then controls the opening of the flow control valve 37A in a feed-back control mode, by using the detection signal of the second flow meter 39b. Thus, the DHF concentration can be maintained constant regardless of the DHF flow rate.

The liquid treatment apparatus in the third embodiment can perform an etching treatment process and a rinse liquid treatment process similar to those in the first and second embodiments.

In the first to third embodiments, the chemical liquid treatment process is a so-called DHF cleaning process, however, not limited thereto, may be another chemical liquid cleaning process, such an APM cleaning process using $NH_4OH$, an HPM cleaning process using HCl and $H_2O_2$, an FPM cleaning process using HF and $H_2O_2$, a BHF cleaning process using HF and $NH_4F$. The chemical liquid treatment process is not limited to a so-called cleaning process, and may be a so-called wet etching process. The process object is not limited to a a semiconductor wafer, and may be an LCD glass substrate, for example.

Example

An experiment was carried out for comparing a rinse treatment process according to the present invention with a conventional rinse treatment process.

Experiment Conditions

After semiconductor wafers W were etched by DHF, a rinse liquid treatment was carried out under the following conditions. In an example of the present invention, the DIW at a total flow rate of 40 L/min was discharged from the two lowermost supply nozzles 11R and 11L for two minutes, and thereafter the DIW at a total flow rate of 90 L/min was discharged from the six process liquid supply nozzles 12R, 13R, 14R, 12L, 13L, and 14L. On the other hand, in a comparative example, the DIW at a total flow rate of 40 L/min was discharged from two process liquid supply nozzles (corresponding to the nozzles 11R and 11L) disposed on a bottom part of a process bath.

Figure 11:
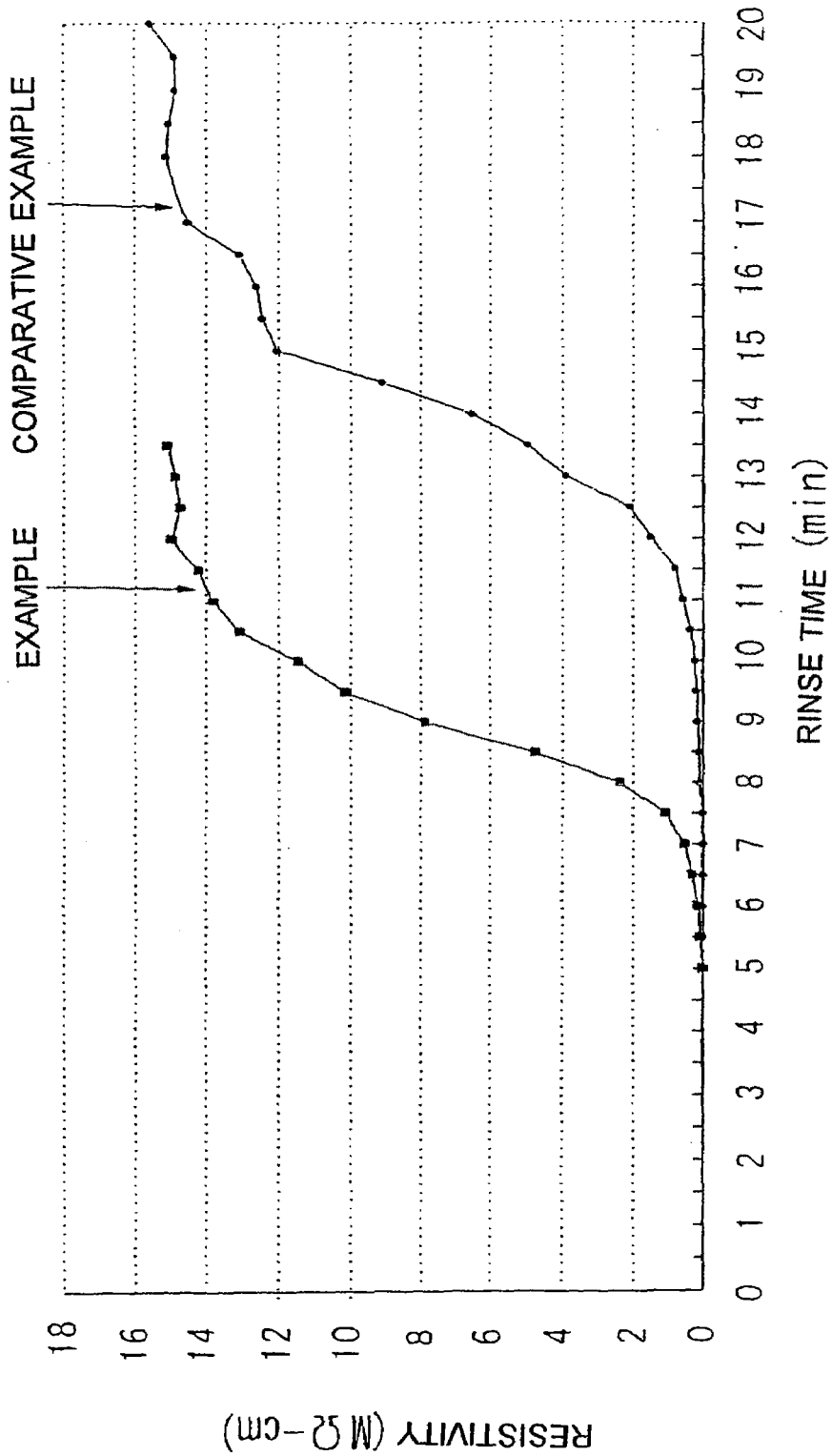
FIG. 11 is a graph showing a recovery of a resistivity in a rinse liquid treatment.

The rinse liquid treatment effect of each of the examples was evaluated based on a change in a resistivity of the liquid in the process bath. As shown in FIG. 11, in the comparative example, it took about 16 to 17 minutes for the resistivity of the liquid in the process bath to reach a value about 14 $M\Omega \cdot cm$ (this value indicates that the DHF in the process bath is sufficiently replaced with the DIW). On the other hand, in the example of the present invention, it took about 10 to 11 minutes (which is about six minutes less than that in the comparative example) for the resistivity of the liquid in the process bath to reach a value about 14 $M\Omega \cdot cm$.

What is claimed:

1. A liquid treatment method comprising:
    placing substrates, within a process bath, such that the substrates are submerged in a process liquid when the process bath is filled with a process liquid, between a first group of process liquid supply nozzles and a second group of process liquid supply nozzles disposed in the process bath, the first group of process liquid supply nozzles being arranged at different levels on one side of the process bath and the second group of process liquid supply nozzles being arranged at different levels on another side of the process bath, each of the first group of process liquid supply nozzles having nozzle holes whose axes are directed obliquely downward to jet a process liquid obliquely downward, and each of the second group of process liquid supply nozzles having nozzle holes whose axes are directed obliquely downward to jet a process liquid obliquely downward;

jetting a rinse liquid, as the process liquid, toward the substrates, from a lowermost one of the first group of process liquid supply nozzles and a lowermost one of the second group of process liquid supply nozzles; and thereafter jetting the rinse liquid toward the substrates, from all of the first and second groups of process liquid supply nozzles at the same time.

2. A storage medium storing a program executable by a control computer of a liquid treatment apparatus, wherein the control computer controls the liquid treatment apparatus to perform a liquid treatment method defined by claim 1 upon execution of the program.

* * * * *